Figure 1:
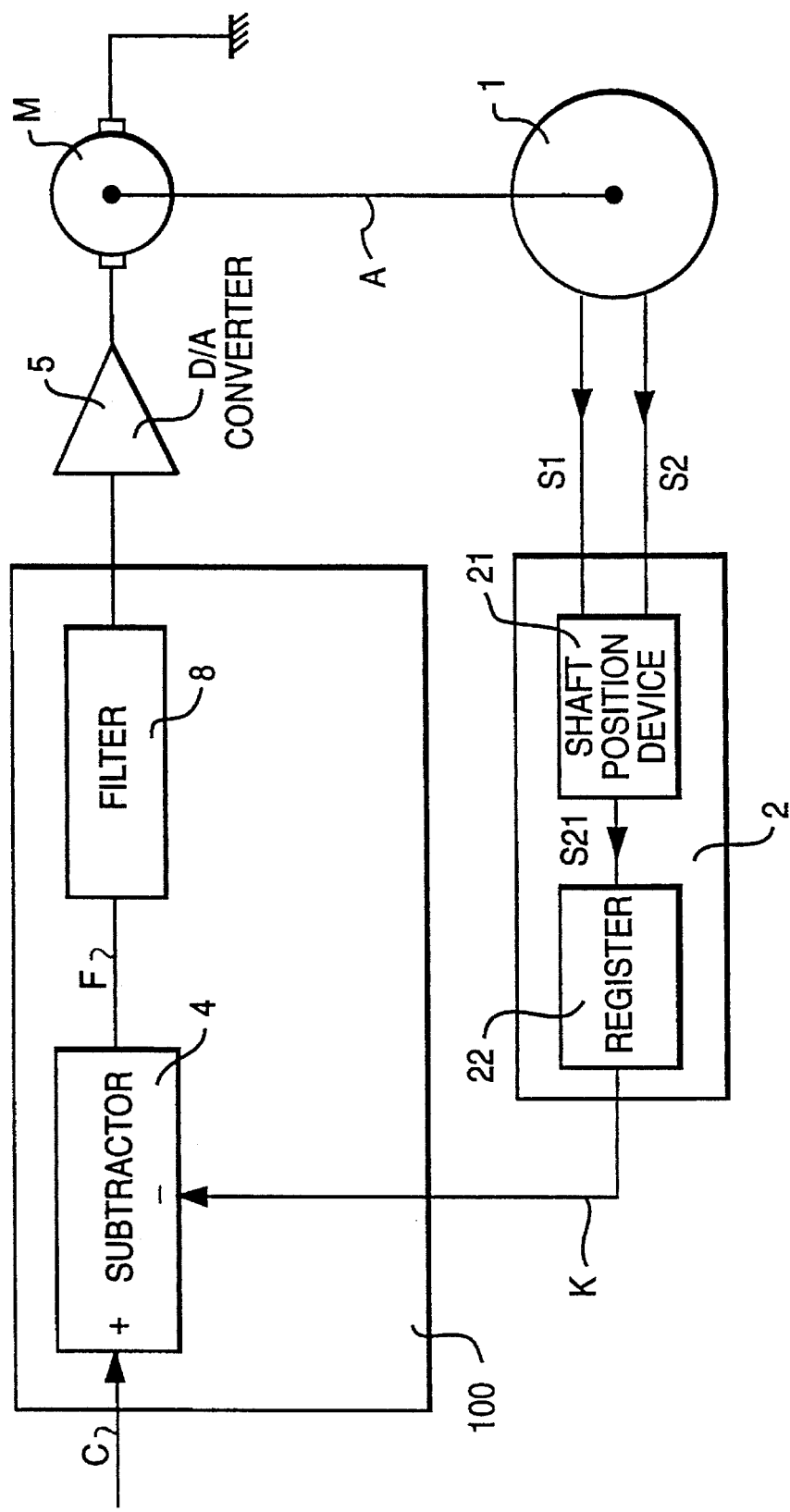

United States Patent [19]
Bec

[11] Patent Number: 5,461,375
[45] Date of Patent: Oct. 24, 1995

[54] FORWARD/BACKWARD COUNTING DEVICE

[75] Inventor: Daniel Bec, Villeneuve Tolosane, France

[73] Assignee: Art Tech Gigadisc, Toulouse, France

[21] Appl. No.: 146,178

[22] PCT Filed: Mar. 10, 1993

[86] PCT No.: PCT/FR93/00238

§ 371 Date: Nov. 10, 1993

§ 102(e) Date: Nov. 10, 1993

[87] PCT Pub. No.: WO93/18588

PCT Pub. Date: Sep. 16, 1993

[30] Foreign Application Priority Data

Mar. 10, 1992 [FR] France ................................... 92 02847

[51] Int. Cl.⁶ ..................................... H03M 1/48
[52] U.S. Cl. ............................................. 341/6
[58] Field of Search ................. 341/6, 11, 7, 13; 250/231.16, 231.17, 231.18

[56] References Cited

U.S. PATENT DOCUMENTS

| | | | |
|---|---|---|---|
| 4,041,483 | 8/1977 | Groff | 341/11 |
| 4,714,913 | 12/1987 | Cohen. | |
| 5,091,643 | 2/1992 | Okutani et al. | 250/231.14 |

FOREIGN PATENT DOCUMENTS 1187868  4/1970  United Kingdom.

Primary Examiner—Brian K. Young
Attorney, Agent, or Firm—Pollock, Vande Sande & Priddy

[57] ABSTRACT

The present invention relates to a forward/backward counting device intended for providing an absolute address of N bits in binary code, the address enabling the position of an object to be deduced from two signals leaving a non-absolute position coder linked to the object. A device generates a first partial address expressed in code which differs from the binary code. A microprocessor is linked to the device and enables the first partial address to be transformed into an absolute address. The invention applies to robotics and metrology.

7 Claims, 9 Drawing Sheets

FORWARD/BACKWARD COUNTING DEVICE

The present invention relates to forward/backward counting devices.

Forward/backward counters are generally used in robotics and sometimes in metrology. They are involved in systems enabling the position of various moving bodies to be referenced. Thus they are present, for example, in the servocontrol loops intended for controlling the positioning of motor shafts.

In order to correct the position of an object, the indication giving the actual position of the said object is compared with an external set-point. The object to be controlled is linked to a position coder which delivers two signals in quadrature. These signals are sent to a forward/backward counter whose function is to provide an indication of position in binary code. This indication is the absolute address of the object. This absolute address cannot be sampled at any time: it is only defined within certain time windows and outside of these windows it may be erroneous.

It is known to those skilled in the art that the forward/backward counter must then be equipped with an output register controlled in synchronism with the signals leaving the position coder.

The invention does not have these disadvantages.

One of the subjects of the invention is a forward/backward counting device intended for providing an absolute address in binary code, the said address enabling the position of an object to be deduced from signals leaving a non-absolute position coder linked to the said object, characterized in that it comprises means intended for generating a partial address consisting of the lowest order bits of the said address expressed in reflected binary code or any other equivalent code.

Figure 2A:
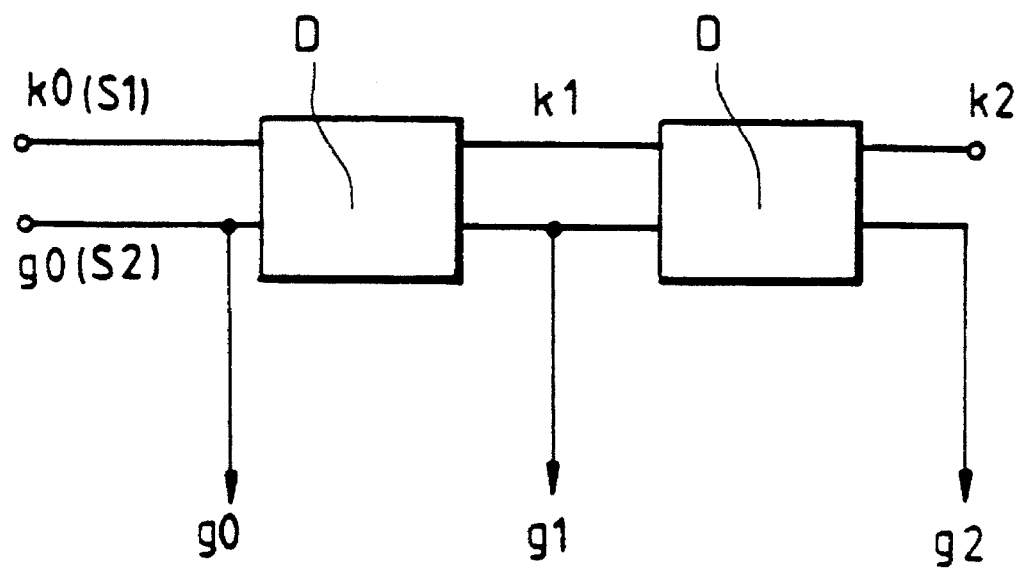
Figure 2B:
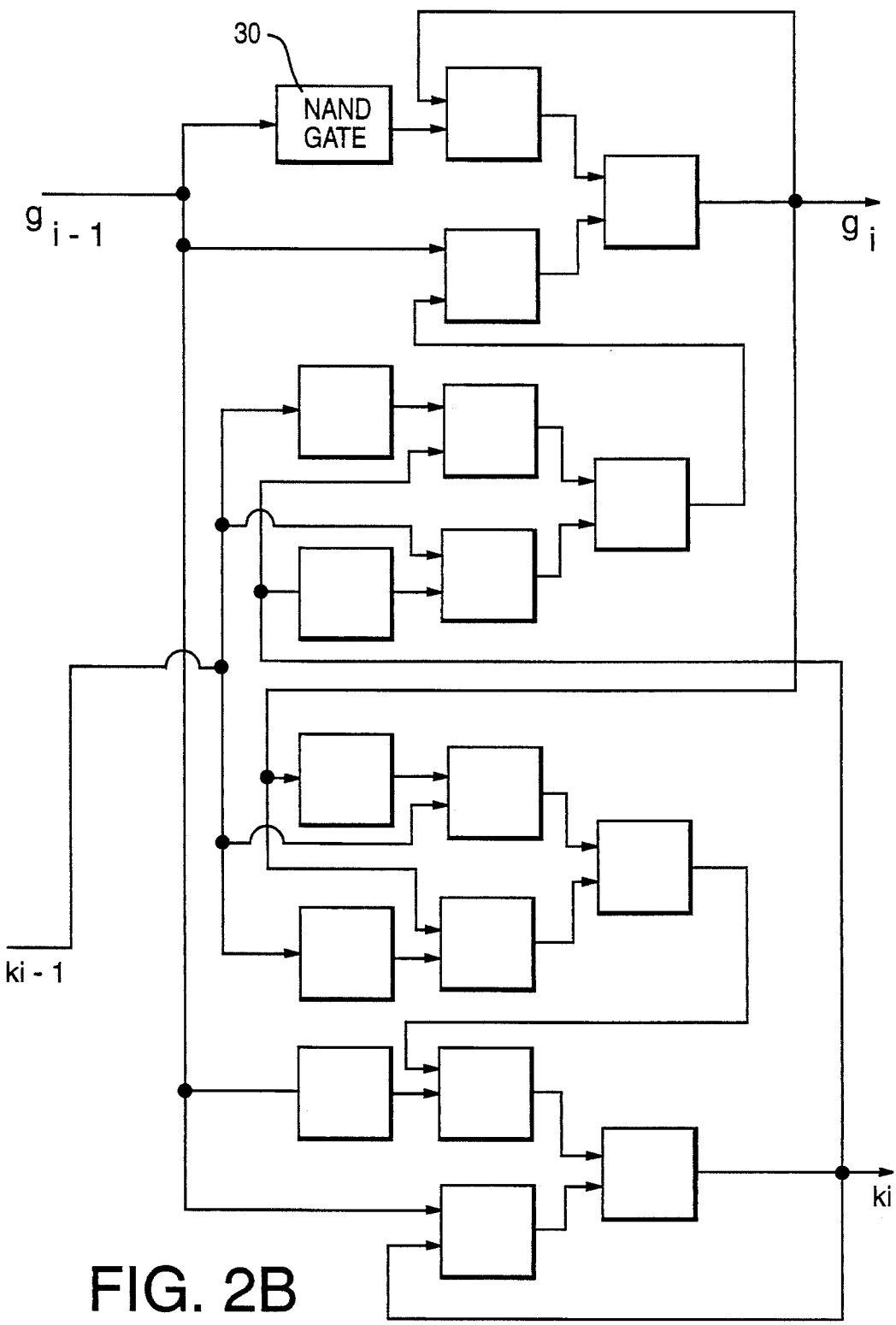
Figure 3:
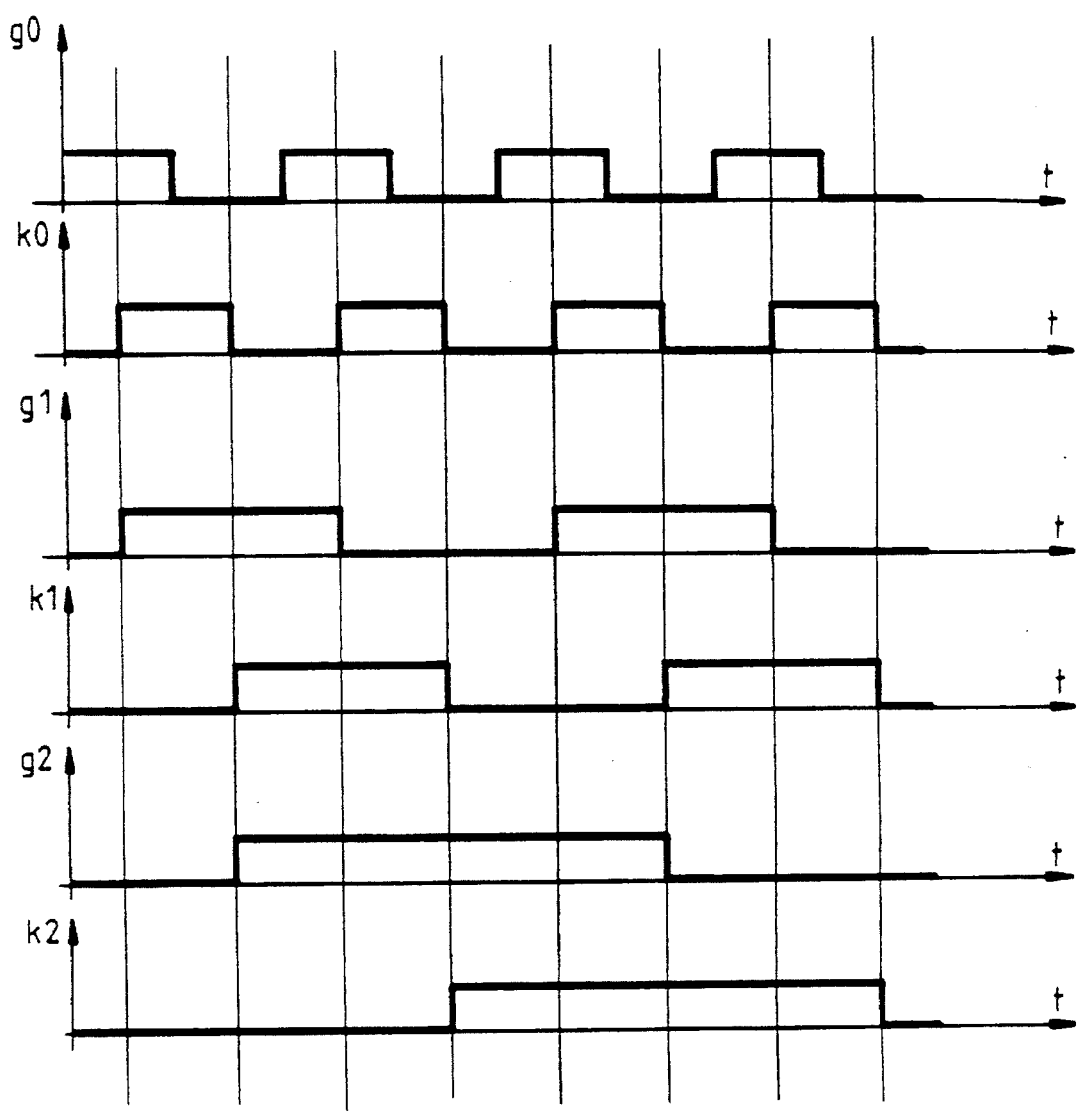
Figure 4:
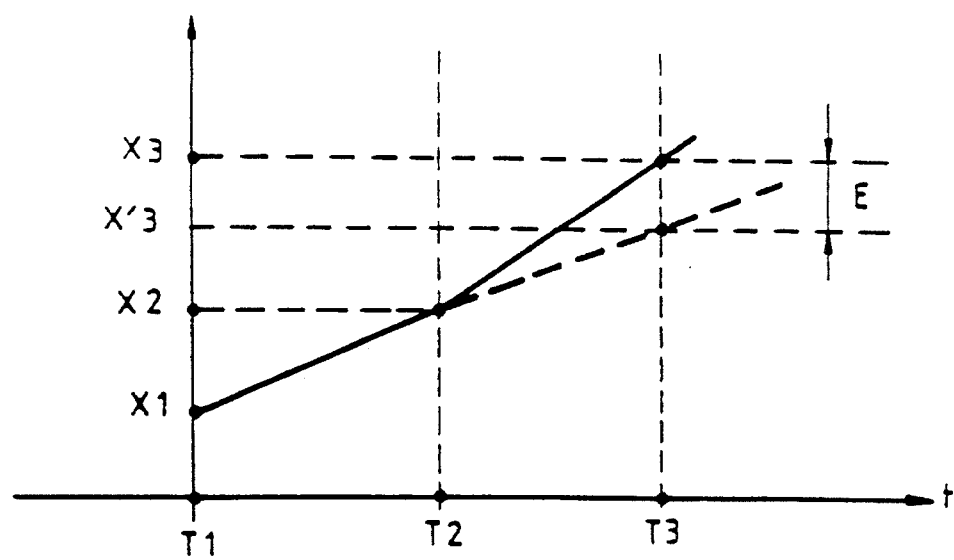
Figure 5:
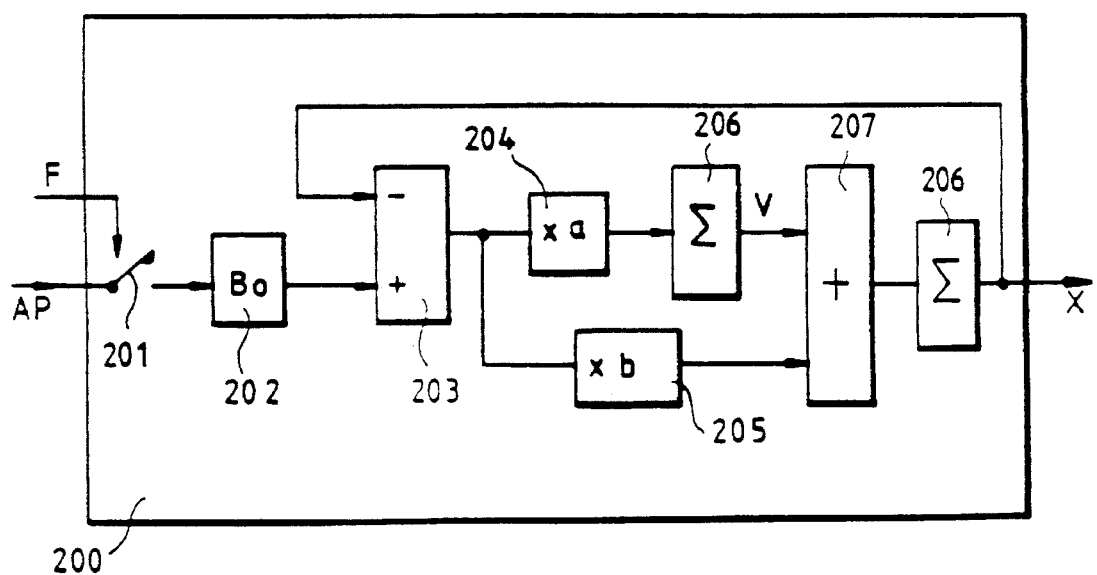
Figure 6:
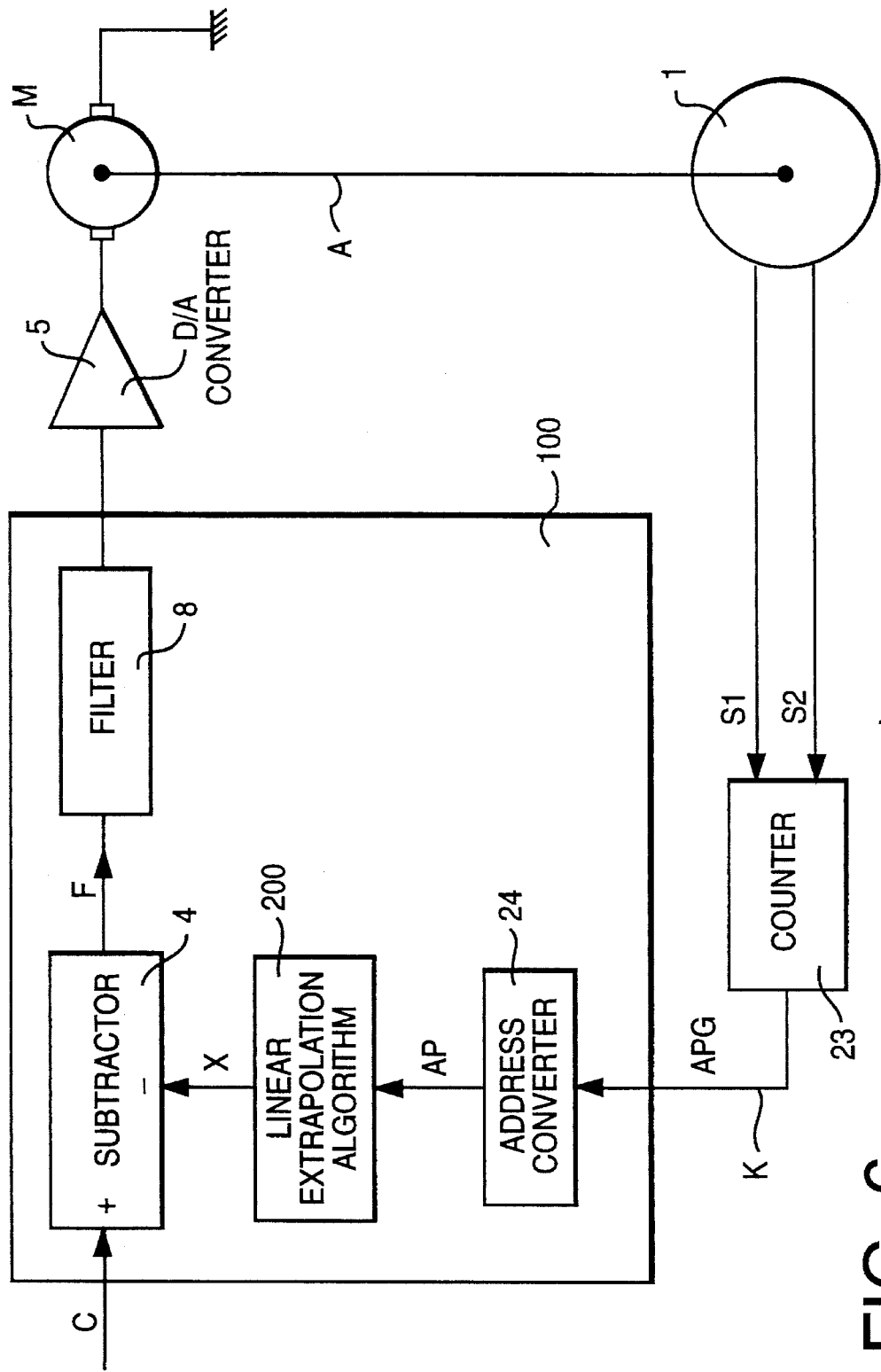
Figure 7A:
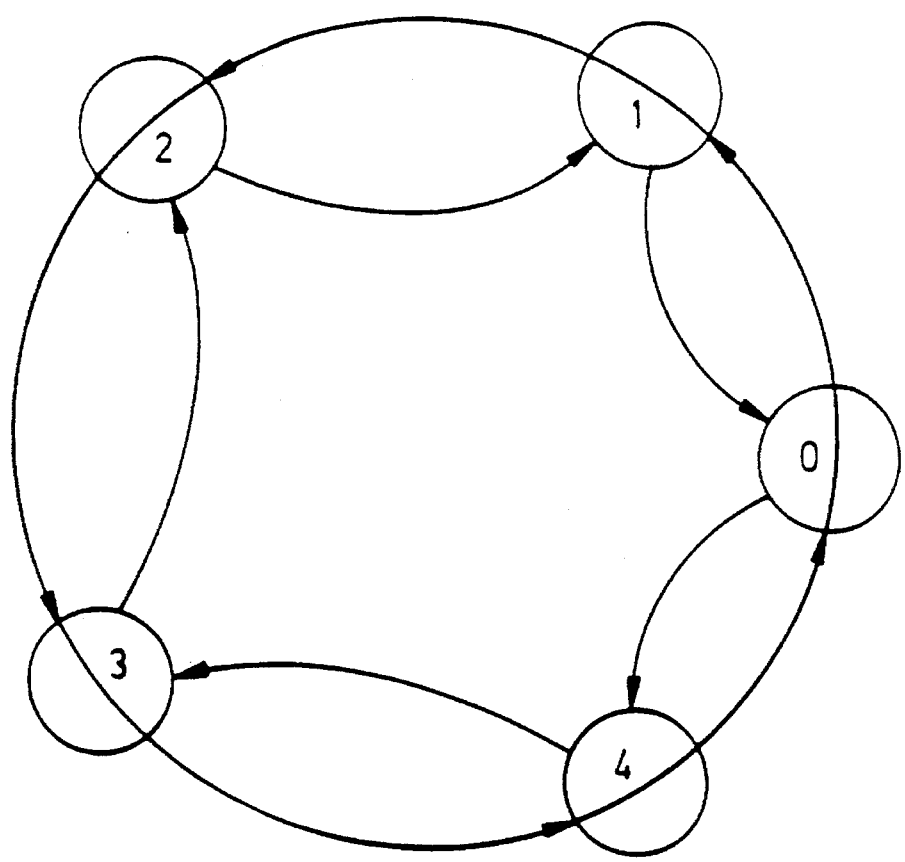
Figure 7A:
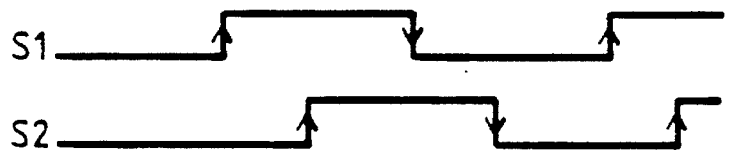
Figure 7B:
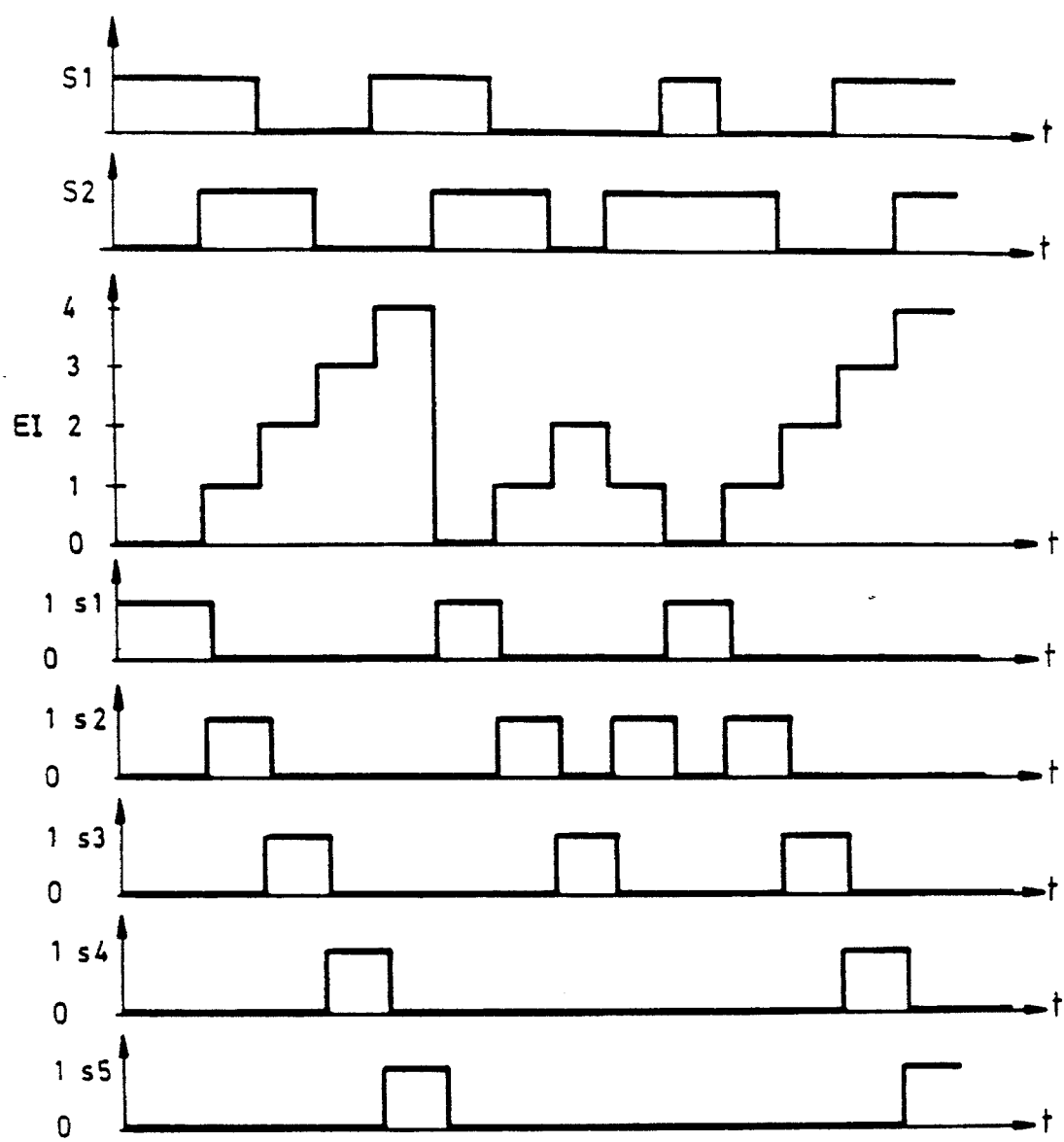
Figure 7B:
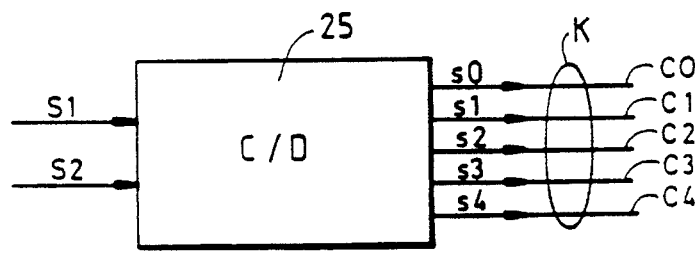
Figure 8:
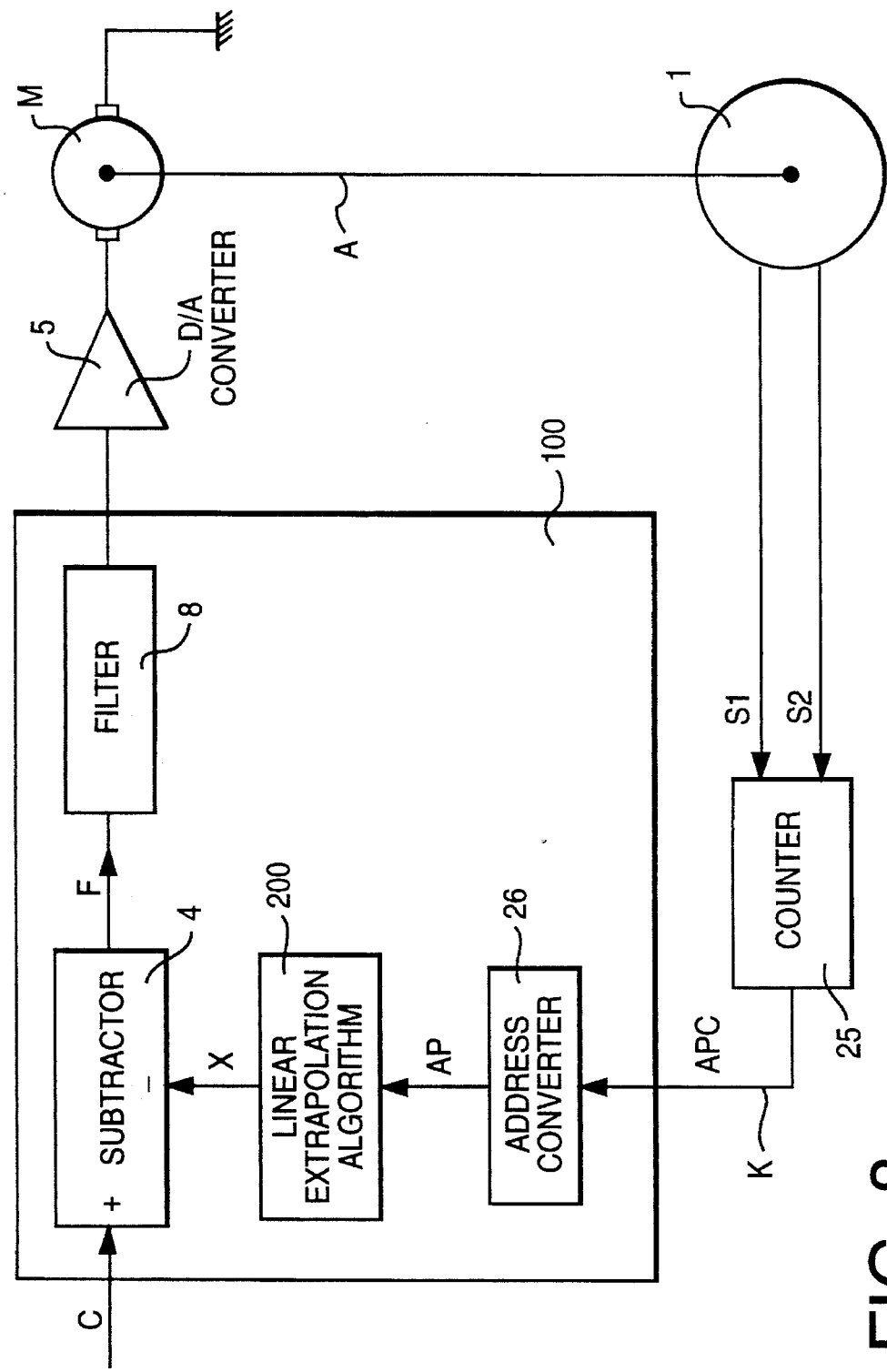

Other characteristics and advantages of the invention will emerge on studying a preferred embodiment, given with reference to the attached figures in which:

FIG. 1 represents the block diagram of a position servocontrol using a forward/backward counter according to the prior art, FIG. 2A represents the block diagram of a forward/backward counter according to a preferred embodiment of the invention, FIG. 2B represents an assembly of logic circuits coming into the construction of the forward/backward counter according to the invention, FIG. 3 represents the timing diagram for the forward/backward counter described in FIG. 2, FIG. 4 represents the curve for determining, by linear extrapolation, the absolute addresses in the case where the forward/backward counter provides merely a partial address, FIG. 5 represents, symbolically, an algorithm for determining the absolute address in the case where the forward/backward counter provides merely a partial address, FIG. 6 represents the block diagram of the position servocontrol using a forward/backward counter device according to a preferred embodiment of the invention, FIG. 7A represents the chart of the internal states of a five-state cyclic forward/backward counter, FIG. 7B represents the input signals, the corresponding internal state and the output signals of the five-state cyclic counter, FIG. 8 represents the block diagram of the position servocontrol using a forward/backward counter according to a second embodiment of the invention.

In all the figures, the same references designate the same elements.

The servocontrols described by FIGS. 1, 6 and 8 are, in essence, produced with the aid of a microprocessor. Thus, each of the devices situated in area 100 of the said figures is the symbolic representation of one operation of the servocontrol algorithm.

FIG. 1 represents the block diagram of a position servocontrol using a forward/backward counter according to the prior art. The object to be controlled is, for example, a motor shaft.

A coder 1 captures the position of the motor shaft A of the motor M. In a general way, this coder is a non-absolute coder which delivers two signals S1 and S2 in quadrature.

In order to reconstruct an indication giving the absolute position of the motor shaft, the use of a forward/backward counter 2 is then required. The forward/backward counter 2 is composed of two devices: a first device 21 which contains the circuits making it possible to obtain, in binary code, the position of the motor shaft A from quadrature signals S1 and S2 and a second device 22 representing the output register controlled in synchronism with the signals S1 and S2.

The signal S21 leaving the device 21 is an integer expressed in binary code. This integer is defined with ambiguity at the time of carry propagation, either upon an increase in its value when the binary number includes at least one string of contiguous "1"s, or upon a reduction in its value when the binary number includes at least one string of contiguous "0"s.

The signal S21 is not therefore available for reading and it is necessary to introduce a sequential logic unit in order to overcome this disadvantage. This is why the output register 22 is introduced.

The wiring element K often includes as many conductors as bits required for coding the absolute position of the motor shaft. In all cases, it makes it possible to send to the microprocessor the complete indication of absolute position of the motor shaft available at the output of the register 22.

This indication is compared with the position set-point C with the aid of the subtractor 4. The discrepancy F leaving the subtractor 4 is sent to the stability filter 8.

It is known by those skilled in the art that a phase advance is required in order to stabilize the loop. This is provided by the filter.

The device 5 consists of a digital/analog converter followed by an amplifier which supplies the motor with power. The circuit which cascades together all the elements just described tends to make the discrepancy F decrease when the said motor is running.

If the absolute position coded in binary is expressed with the aid of N bits, the wiring element K must have N wires in order to transmit the indication in one single operation or else N/n wires in order to transmit the indication in n operations.

FIG. 2A represents the block diagram of a forward/backward counter according to the preferred embodiment of the invention. It was stated earlier that the forward/backward counters according to the prior art must comprise an output register 22 controlled in synchronism with the signals leaving the position coder. The invention does not have this disadvantage since the binary code used changes by one bit only from one combination to the next. Indeed, according to the invention, the absolute position of the motor shaft is coded according to the reflected binary code or according to any other equivalent code. This therefore makes it possible not only to do away with the output register 22, but also to take into account at each moment the output signal from the forward/backward counter without having to wait for a time window.

As a reminder, the table below recalls the progression of the reflected binary code or Gray code when the latter is defined, for example, on three bits b2, b1, b0:

| b2 | b1 | b0 |
|----|----|----|
| 0  | 0  | 0  |
| 0  | 0  | 1  |
| 0  | 1  | 1  |
| 0  | 1  | 0  |
| 1  | 1  | 0  |
| 1  | 1  | 1  |
| 1  | 0  | 1  |
| 1  | 0  | 0  |

It is seen that this code follows a progression such that there is a change of one bit only from one combination to the next.

The forward/backward counter of FIG. 2A provides, according to a preferred embodiment of the invention, a partial address with three bits: g2, g1, g0, since, as will be seen later, it is not necessary to transmit the whole absolute address but only its lowest order bits.

The two signals S1 and S2 leaving the position coder are here denoted k0 for S1 and g0 for S2.

A device D receives the two signals k0 and g0 and delivers the two signals k1 and g1. Similarly, a second device D receives the two signals k1 and g1 and delivers the signals k2 and g2 (k2 is not used).

The circuits contained in the devices D are logic circuits combined in such a way that the various signals gi and ki (i=0, 1, 2) are related as follows:

$$gi = \bar{g}(i-1) \cdot gi + g(i-1) \cdot (k(i-1) \oplus ki)$$

$$ki = g(i-1) \cdot ki + \bar{g}(i-1) \cdot (i(i-1) \oplus gi)$$

In the above expressions $\bar{g}i$ represents the logical complement of $gi$. The various operations represented symbolically by the signs "·", "+", and "⊕" are the functions known to those skilled in the art by the respective names "and", "or" and "exclusive or".

The logic circuits enabling the signals gi and ki to be generated from the signals g (i−1) and k (i−1) are represented in FIG. 2B.

This is a combination of elementary logic circuits 30 of the NAND or NOT AND type. Those skilled in the art know that elementary circuits other than NAND circuits would enable the same result to be arrived at.

According to the embodiment described, the two devices D enable a partial address with 3 bits to be generated. Generally P−1 devices D enable a partial address with P bits to be generated.

FIG. 3 represents the timing diagram for the forward/backward counter described in FIG. 2A. The curves describing the signals gi and ki (i=0, 1, 2) as a function of time exhibit no error while progressing. During a change of state a single binary digit commutes and the binary encoded integer is known without ambiguity.

According to the invention, it is not necessary for the forward/backward counter to generate an absolute address in order to create the indication giving the position of the motor shaft. A partial address is sufficient on condition that the absolute address is reconstructed.

FIG. 4 represents the computational principle of an algorithm enabling the absolute address to be reconstructed by linear extrapolation. This algorithm is the simplest one demonstrating the feasibility of restoring the absolute address from its lowest order bits. The principle thereof is based on the fact that if the remainder from the division modulo Q of a quantity X is known at every moment, and if the first two absolute addresses X1 and X2 are known, the succeeding absolute addresses can be deduced therefrom. Q represents the quantization of the partial address: for 3 bits $Q=2^3=8$.

In the curve of FIG. 4, the address Xj (j=1, 2, 3) is the absolute address which must be provided at time Tj.

The times T1, T2, T3 are such that $$T3-T2=T2-T1=T.$$

X'3 is the linear extrapolation of X1 and X2.
It follows therefore that:

$$X'3-X2=X2-X1.$$

i.e.:

$$X'3=2X2-X1.$$

The error E corresponding to the discrepancy between the address X3 to be provided and the address X'3 obtained by linear extrapolation is:

$$E=X3-X'3$$

i.e.:

$$E=X3-2X2+X1$$

If E is less than Q/2, then:

$$E=(X3 \bmod Q-2X2+X1) \bmod Q$$

i.e. E=(x3−2X2+X1) mod Q
with x3=X3 mod Q, x3 representing the measure of the lowest order bits.

γ max being the maximum acceleration of the quantity X, the maximum error E max which may be obtained is:

E max=γ max×ΔT². We must therefore have Q<2×γ max×ΔT².

In this case, the address X3 provided can therefore be written:

$$X3=2X2-X1+(x3-2X2+X1) \bmod Q.$$

The computations described above are carried out with the aid of a microprocessor. According to the chosen preferred embodiment, these computations are performed by the microprocessor computing the position error of the motor shaft to be controlled.

In addition to the function for extrapolating and reconstructing the absolute address, the algorithm according to the invention enables the likelihood of the data to be monitored. The error E is then compared with a likelihood value EV. The value EV is chosen so as to be small compared with E max. If the error E is less than or equal to EV, the algorithm continues without diversion. Otherwise, the value of the error E is set to zero, thus allowing elimination of the outlying samples.

FIG. 5 represents, symbolically, another algorithm allowing reconstruction of the absolute address. This algorithm is represented symbolically by the device 200. Inside this symbolic device, each mathematical operation is represented by an elementary symbolic device. Each of these elementary operations is known to those skilled in the art. They are merely recalled in order to undertake a complete description of the algorithm.

The partial address AP, consisting of the lowest order bits of the absolute address, is sent to the symbolic device 200 and the absolute address X is recovered at the output of the said device. The various elementary symbolic devices (201, 202, 203, 204, 205, 206, 207) are combined in such a way that the addresses AP and X are related as follows:

$$\frac{X}{AP} = \frac{b \times \Sigma + a \times \Sigma^2}{1 + b \times \Sigma + 1 \times \Sigma^2}$$

$$\text{with } \Sigma = \frac{1}{1 - z^{-1}}$$

and, as is known by those skilled in the art, $z = e^{iwT}$ $\omega$ being the pulsatance in the Fourier analysis sense, of the signal associated with the partial address AP and $$T = \frac{1}{F},$$

F being the frequency for sampling the signal associated with the partial address AP, the said sampling being symbolized by the switch 201 and retention of the value of the sample being ensured until the arrival of the succeeding sample by the device 202.

The multiplier 204, with multiplicative factor a, determines the low-pass filter for the absolute address X, whilst the multiplier 205, with multiplicative factor b, gives the time constant of the low-pass filter for the speed.

The devices 206 symbolize the operation $$\Sigma = \frac{1}{1 - z^{-1}}$$

that is to say the adding of the value of each new sample, present at the input of the device, to the value which its output had at the instant of arrival of this sample.

Finally, the device 203 symbolizes the differencing carried out between the signals originating from the second device 206 and from the device 202 respectively, whilst the device 207 symbolizes the summation carried out on the two signals originating from the device 202 and from the first device 206 respectively.

This algorithm allows modelling and identification of the speed by exponential averaging. It should be noted that it lessens the effect of the error-affected samples with the aid of the filtering which it performs on the said samples.

According to the preferred embodiment, a complete absolute address with N bits is reconstructed from a partial address with 3 bits leaving the forward/backward counter. The indication given by a partial address with 2 bits is insufficient since the ambiguity in the position of the motor shaft might not be resolved for certain particular values of the speed. For greater safety, in particular when substantial noise is present in the motor shaft position signal, there may be a need to increase the redundancy of the partial address by increasing its number of bits, for example by raising to 4 bits or more. However, 3 bits are generally sufficient, in the absence of substantial noise, to reconstruct any complete absolute address with a minimum of redundancy.

Whatever the algorithm for reconstructing the absolute address, initialization of the absolute addresses is done with the aid of an external sensor. It is done, as is known to those skilled in the art, with the aid of a known position stop, the said position being read off at zero speed.

FIG. 6 represents the block diagram of a position servo-control using a forward/backward counter device according to the preferred embodiment of the invention.

The coder 1 captures the position of the motor shaft A and delivers the two signals S1 and S2 in quadrature. The indication leaving the forward/backward counter 23 is coded with the Gray code with the aid, for example, of 3 bits.

Under these conditions, the wiring element K consists of 3 wires linked to the microprocessor 100. It was stated earlier that 3 bits enable an absolute address with N bits to be reconstructed. According to the preferred embodiment of the invention N=24. It is therefore an advantage of the invention that it is possible to transmit in one single operation and at any time the indication allowing reconstruction of the absolute address with the aid, for example, of 3 wires instead of 24.

The wiring element K sends the partial address coded with the Gray code APG, consisting preferably of the three bits g0, g1, g2, to the device 24, which converts the said partial address into a partial address expressed in binary AP. The device 24 is known to those skilled in the art and is therefore not described.

The reconstruction algorithm 200 then makes it possible to generate the absolute position address which, when compared with the set-point C, gives the position discrepancy F.

The devices 8 and 5 are the same as those described in connection with FIG. 1.

In the algorithms described earlier for absolute address extrapolation and reconstruction, the speed is computed either over the two known samples immediately preceding the new sample whose address it is wished to extrapolate as described with reference to FIG. 4, or from all the preceding samples with an exponential type averaging as used in extrapolating the address described with reference to FIG. 5. The speed can also be computed from the sample immediately preceding the new sample, whose address it is wished to extrapolate, and from a much older sample so as to make the inaccuracy in the speed less sensitive to the inaccuracy in the address of the two samples serving to determine it. Any other method combining the addresses of older samples with the address of the latest known sample in order to obtain a value of the speed can be used in the device according to the invention. It should also be noted that the accuracy with which the said speed is known is more important than the equality of the said speed and the actual speed of the object at the time when it is computed, it always being possible for the systematic error introduced into the said speed to be evaluated, bounded above and taken into account within the limits of operation of the algorithm.

Taking up again the equations written in the case of the simplest linear extrapolation described with reference to FIG. 4, it follows, on introducing the speed V, that:

$$X'3 = X2 + V \times T$$

$$E = X3 - X2 - V \times T$$

The absolute uncertainty in the error E, which is denoted $\Delta E$, is:

$$\Delta E = \Delta X_3 + \Delta X_2 + \Delta(V \times T)$$

The values of X being quantized, the errors in X3 and X2 are therefore equal to a quantization increment which is taken as unity, i.e.:

$$\Delta X_3 = \Delta X_2 = 1$$

In order to restore the address X3 without ambiguity, we must have:

$$Q < 2(E\ max + \Delta E),$$

i.e.

$$Q < 2(\gamma max \times T^2 + \Delta X_3 + \Delta X_2 + \Delta(V \times T))$$

$\Delta(V \times T) = V \times \Delta T + T \times \Delta V \cong T \times \Delta V$, since the sampling period is very accurate: it is provided by the clock for time referencing the whole device, which can be a quartz clock. It therefore follows that:

$Q < 2 (\Delta X_3 + \Delta X_2) + (\gamma max \times T^2 + T \times \Delta V)$. With the maximum values of $\Delta X_2$ and $\Delta X_3$, it follows that:

$$Q < 4 + 2(\gamma max \times T^2 + T \times \Delta V)$$

With a speed computed in such a way as to limit its inaccuracy arising from the inaccuracy in the preceding absolute addresses, and with an acceleration which remains small or with a sampling at high frequency, hence with T small, the term $2 (\gamma max \times T^2 + T \times \Delta V)$ can be kept much less than 1, so that in order to be able to extrapolate the address X3 without ambiguity it is sufficient to take $Q \geq 5$. Instead of using a binary counter it is then possible to use a cyclic so-called ring counter. The smallest usable value being Q=5, a five-state cyclic counter can be used.

FIG. 7A represents the chart of the internal states as well as the operating table of a five-state forward/backward counter. The occurrence of an edge of one of the two signals S1 or S2 coming from the coder causes, depending on the state of the other signal, movement of the internal state of the said coder/decoder in the positive direction or in the negative direction as is apparent in the said operating table.

FIG. 7B represents, for two signals S1 and S2 coming from the coder (1) entering the forward/backward counter 25, the corresponding internal state EI of the said forward/backward counter and the output signals in the case where a wiring element K with five conductors C0, C1, C2, C3 and C4 is used to transmit the five elementary positions of the partial address to the microprocessor. This choice is appropriate when both speed and accuracy are desired in the positioning of an object: for example a fast-moving motor shaft fitted with a coder whose graduation shows a large number of marks per revolution. The duration of transmission of the partial address to the microprocessor managing the position of the motor shaft is then minimized. The five signals s0, s1, s2, s3 and s4 carried by the conductors C0, C1, C2, C3 and C4 respectively each represent the state of the counter 25 bearing the same reference (0, 1, 2, 3, 4). In order to have the option, as in the case of the Gray code, of being able to sample the address coming from the forward/backward counter at any time, the signals si (i=0, 1, 2, 3, 4) are prolonged slightly beyond the time of change of state of the forward/backward counter so as to never have a 0 level on the five conductors simultaneously; it may be judicious, when two signals si are present simultaneously at the 1 level, to choose the one which corresponds to the first state encountered in the positive direction of the changes of state of the forward/backward counter. Thus 0 takes precedence over 1, 1 over 2, 2 over 3, 3 over 4 and 4 over 0. Under these conditions, as in the case of the Gray code, the error is at most one quantization increment of the coder.

FIG. 8 represents the block diagram of a position servo-control using a forward/backward counter device according to a second embodiment of the invention. This device differs from the previous one only by the forward/backward counter. A cyclic forward/backward counter 25 of the same type as that described earlier (cf. FIGS. 7A and 7B) is used. A device 26 enables the partial address APC generated by the forward/backward counter to be converted into a partial address AP expressed in binary code. This device is known to those skilled in the art and it is unproductive to describe it in the present patent application. The remainder of the description is identical to what was described in FIG. 6.

I claim:

1. Forward/backward counting device for providing an absolute address of N bits in binary code, the address enabling the position of an object to be deduced from two signals leaving a non-absolute position coder linked to the object, the device comprising means for generating a first partial address expressed in a code which differs from the binary code and is limited to the lowest order bits of the absolute address; and a microprocessor linked to the generating means and enabling the first partial address to be transformed into the absolute address.

2. Device according to claim 1, wherein the microprocessor further comprises first means for converting the first partial address into a second partial address expressed in binary code and second means enabling the absolute address to be reconstructed from the second partial address with the aid of a reconstruction algorithm.

3. Device according to claim 2, wherein the means intended for generating a first partial address comprise P−1 sub-assemblies, the sub-assembly of rank i (i=1, 2, . . . , P−1) generating two signals from the two signals leaving the sub-assembly of rank i−1 which precedes it, one of the two signals generated by the sub-assembly of rank i constituting the bit of rank i of the first partial address expressed in reflected binary code, the sub-assembly of rank 1 having the two signals leaving the position coder as input signal.

4. Device according to claim 2, wherein the means for generating a first partial address comprise a cyclic counter with at least five states.

5. Device according to any one of claims 2 to 4, characterized in that the algorithm for reconstructing the absolute address is a linear extrapolation algorithm.

6. Device according to any of claims 2 to 4, characterized in that the algorithm for reconstructing the absolute address X from the partial address AP is an algorithm for modelling and identifying the speed of the object by exponential averaging such that:

$$\frac{X}{AP} = \frac{b \times \Sigma + a \times \Sigma^2}{1 + b \times \Sigma + a \times \Sigma^2}$$

with $\Sigma = \dfrac{1}{1 - Z^{-1}}$ and $Z = e^{i\omega t}$

ω being the pulsatance, in the Fourier analysis sense, of the signal associated with the partial address AP, and $$T = \frac{1}{F},$$

F being the frequency for sampling the signal associated with the partial address AP.

7. Device according to claim 5, characterized in that the reconstruction algorithm comprises an algorithm allowing the monitoring of the likelihood of the raw data representing the measure of the lowest order bits of the absolute address.

* * * * *